United States Patent [19]

Cherry et al.

[11] Patent Number: 5,693,968
[45] Date of Patent: Dec. 2, 1997

[54] BI-DIRECTIONAL, FAST-TIMING, CHARGE COUPLED DEVICE

[75] Inventors: Michael L. Cherry; Steven B. Ellison, both of Baton Rouge, La.

[73] Assignee: Board of Supervisors of Louisiana State University and Agricultural and Mechanical College, Baton Rouge, La.

[21] Appl. No.: 677,825

[22] Filed: Jul. 10, 1996

[51] Int. Cl.[6] .......................... H01L 27/148; H01L 29/768
[52] U.S. Cl. .......................... 257/231; 257/239; 257/240; 257/241
[58] Field of Search .......................... 257/231, 239, 257/240, 241; 365/183; 348/300, 301, 303

[56] References Cited

U.S. PATENT DOCUMENTS

| | | | |
|---|---|---|---|
| 4,165,539 | 8/1979 | Aichelmann, Jr. | 365/183 |
| 4,744,057 | 5/1988 | Descure | 365/183 |
| 5,340,977 | 8/1994 | Kojima et al. | 250/208.1 |

OTHER PUBLICATIONS

J. Janesick et al., "History and Advancements of Large Area Array Scientific CCD Imagers," pp. 1–67 in S. Howell (ed.), *Astronomical CCD Observing and Reduction Techniques*, ASP Conf. Series, vol. 23 (1992).
M. Cherry et al., "Charge Coupled Devices with Fast Timing for Space Physics," pp.261–274 in *MASS/AIRWATCH, Huntsville Workshop Report*(Huntsville, Alabama Aug. 7–8, 1995).
P.Suni, "Custom Photodetector Arrays Meet Design Challenges," *Laser Focus World*(Apr. 1994).
Loral CCD442A Specification Sheet (1993).

Primary Examiner—Ngan V. Ngo
Attorney, Agent, or Firm—John H. Runnels

[57] ABSTRACT

A fast-timing bi-directional charge coupled device ("CCD") is disclosed. The CCD operates at a much faster overall rate than conventional CCD's, while paradoxically slowing down the readout rate of the pixels. Lower power consumption is required, less heat is generated, thermal noise is lower, and digital noise is lower. The novel CCD is capable of 10–25 μsec timing resolution (or even faster). The configuration entirely eliminates the (formerly) rate-determining step of transferring data "horizontally" from the "top" of the CCD columns. Instead, the charges on columns are transferred either "up" or "down" in an alternating manner. For example, the charges in odd-numbered columns might be transferred one row "up" with each clock cycle, and charges in even-numbered columns might be transferred "down." This alternating charge transfer architecture is termed "bi-directional." There is no "horizontal" transfer of data off the chip; rather, each column outputs to a separate amplifier, preferably located on-chip. There is no need for a shutter in a low flux setting, although a shutter could be used for a high flux application. Without a shutter, the readout from each column is continual, without interruption; i.e., there is no "dead time" when light is not being detected. Assuming that light impinges on adjacent pixels in at least two different columns, the position and time of incoming light is reconstructed from the readouts of adjacent columns. The position of the impinging light is determined as the midpoint of readouts from adjacent columns; and the time of light arrival is proportional to the difference in readout from the adjacent columns. Unlike a conventional CCD, in a fast-timing, bi-directional CCD the clock time equals the time resolution of the overall image. Thus a relatively slow clock time of 10 μsec provides a very fast image time resolution of 10 μsec. In comparison to the 30 msec time resolution that is characteristic of conventional CCD's, the fast-timing bi-directional CCD can have a time resolution at least three orders of magnitude faster. The need for fast horizontal clocking is eliminated, as is the need for cooling. The fastest existing conventional CCD's can have a readout rate of about $10^6$ pixels per second. The novel fast-timing CCD's can have a readout rate of $10^7$ pixels per second, or even higher. Although the readout architecture of the novel fast-timing bi-directional CCD's is new, no new fabrication technologies are needed to construct the novel CCD's.

16 Claims, 4 Drawing Sheets

PRIOR ART

BI-DIRECTIONAL, FAST-TIMING, CHARGE COUPLED DEVICE

The development of this invention was partially supported by the Government under grant number NAGW-3744 awarded by the National Aeronautics and Space Administration, and under contract number NASA/LEQSF (1994–97)-IMP-02 from the Louisiana Board of Regents. The Government has certain rights in this invention.

This invention pertains to charge coupled devices, particularly to novel charge coupled devices that operate faster than those currently available, with less power consumption, and lower levels of thermal noise and other noise.

Charge coupled devices (CCD's) are commonly used in imaging applications. CCD's are high-resolution, reliable digital devices with good quantum efficiency over a wide range of wavelengths from the near infrared to soft x-rays. Typically, however, scanning speed in CCD's has been limited to video rates (about 30 frames/second). Presently available CCD's may be too slow for applications that require fast timing or dynamic image capture. Examples of such applications include, e.g., high-speed automated inspection of manufacturing or packaging lines, short-duration exposures of rapidly moving objects, surveillance from a moving vehicle or aircraft, and high-resolution microscopic studies of transient phenomena under conditions where a mechanical shutter would induce unacceptable vibrations.

In astronomy, observation of transient or highly variable sources like x-ray binaries or AM Hercules stars requires time resolutions previously available only with photomultiplier tubes. Observations of occultations require millisecond timing. Wide-angle searches for optical counterparts of gamma ray bursts would also benefit from higher timing resolution. Although photomultipliers have nanosecond timing capability, they are not simultaneously capable of wide-field imaging. In addition, photomultipliers are rapidly becoming less and less available at large telescope facilities due to replacement by CCD's.

As illustrated schematically in FIG. 1, a conventional CCD 2 is a rectangular array of pixels 4; the typical size of a pixel 4 is about 10 µm×10 µm. CCD's usually have hundreds (or thousands) of columns, and hundreds (or thousands) of rows. If a photon impinges on a particular pixel, a packet of charge is produced at that location, a charge whose amplitude is proportional to the amount of energy deposited.

The dislodged charge must then be picked up and detected. In a conventional CCD 2, as illustrated in FIG. 1, at each clock cycle the charge (or absence of charge) on each pixel 4 is moved "vertically" one row in the direction of the arrows, to the pixel above it in the same column. At the "top," the charges from the top pixels of each column are transferred by readout register 6 "horizontally" to amplifier 8 as shown by the arrow. In most current applications, the detector is shut off (e.g., with a shutter) while the charges are moving "up" the respective columns and "across" to the amplifier. After the last charges have been collected and transferred off the array, the shutter is re-opened for a time, and the process can begin again. (In both the specification and the claims it is understood, of course, that in reference to the architecture of a CCD, directional terms such as "up," "down," "vertical," "horizontal," and the like are not necessarily defined with respect to the direction of local gravitational force; rather, such directional terms are defined relative to one another, consistent with the directions of the Cartesian axes defining the rows and columns of pixels.)

With a very fast data transfer rate off the "top" of the CCD (~10 MHz), a large-area CCD (~1,000,000 pixels) can be read at an overall rate of about 30 images per second. Faster speeds have typically not been possible, due to the time it takes to read out the large number of pixels. Furthermore, a fast data transfer rate consumes substantial power, generates substantial heat (and thus produces thermal noise), and increases the level of digital noise.

J. Janesick et at., "History and Advancements of Large Area Array Scientific CCD Imagers," pp. 1–67 in S. Howell (ed.), *Astronomical CCD Observing and Reduction Techniques, ASP Conf. Series*, vol. 23 (1992) provides an overview of current CCD technology. See also P. Suni, "Custom Photodetector Arrays Meet Design Challenges," *Laser Focus World* (April 1994).

The fastest currently available conventional large-area CCD known to the inventors is the Loral-Fairchild CCD442A, a 2048×2048 array of $(15 \ \mu m)^2$ pixels with a total image area of $(30 \ mm)^2$. The CCD442A is a relatively large-area scientific CCD array capable of fast readout. See *Loral CCD442A Specification Sheet* (1993). In the multi-pinned phase mode, thermal noise is 25 $pA/cm^2$ at 25° C.; and readout noise is 7 $e^-$ at a 250 k/sec readout rate. By reading out the left and right halves in parallel, and binning into 8×8 "super pixels," the chip is capable of a full frame readout in 50 msec. The 5 MHz clocking required to obtain the Loral 442A's 50 msec readout time produces a significant amount of noise, and has a relatively high power consumption.

Also being disclosed to fulfill the inventors' duty of candor, although not prior art to the present invention, is M. Cherry et al., "Charge Coupled Devices with Fast Timing for Space Physics," pp. 261–274 in *MASS/AIRWATCH, Huntsville Workshop Report* (Huntsville, Ala. Aug. 7–8, 1995).

A novel fast-timing, bi-directional CCD has been discovered. The novel CCD operates at a much faster overall rate than do conventional CCD's, while paradoxically slowing down the readout rate of the pixels. Lower power consumption is required, less heat is generated, thermal noise is lower, and digital noise is lower. The novel CCD is capable of 10–25 µsec timing resolution (or even faster).

The novel configuration entirely eliminates the (formerly) rate-determining step of transferring data "horizontally" from the "top" of the CCD columns. Instead, the charges on columns are transferred either "up" or "down" in an alternating manner. As illustrated in the embodiment shown in FIG. 2, for example, in CCD 102 the charges 110 from pixels 104 in odd-numbered columns might be transferred one row "up" with each clock cycle as shown by the arrows, and charges in even-numbered columns might be transferred "down." This novel alternating charge transfer architecture is termed "bi-directional." There is no "horizontal" transfer of data off the chip; rather, each column outputs to a separate amplifier 106 or 108, preferably located on-chip. (Alternatively, a group of several columns could output to a single amplifier 106 or 108.) To the inventors' knowledge, there have been no prior suggestions to build a CCD using such a bi-directional architecture.

There is no need for a shutter in a low flux setting, although a shutter could be used for a high flux application. Without a shutter, the readout from each column is continual, without interruption; i.e., there is no "dead time" when light is not being detected. Assuming that light impinges on adjacent pixels in at least two different columns to create a charge "cloud" 110 as shown in FIG. 2, the position and time of incoming light may be reconstructed from readouts of adjacent columns. The position of the impinging light is determined as the midpoint of readouts from adjacent columns; and the time of light arrival is proportional to the difference in readout from the adjacent columns.

Unlike a conventional CCD, in a fast-timing, bi-directional CCD the clock time equals the time resolution of the overall image. Thus a relatively slow clock time of 10 μsec provides a very fast image time resolution of 10 μsec. In comparison to the 30 msec time resolution that is characteristic of conventional CCD's, the fast-timing bi-directional CCD can have a time resolution at least three orders of magnitude faster. The need for fast horizontal clocking is eliminated, as is the need for cooling. The fastest existing conventional CCD's can have a readout rate of about $10^6$ pixels per second. The novel fast-timing CCD's can have a readout rate of $10^7$ pixels per second, or even higher. The timing resolution of the device may be significantly faster than that of conventional CCD's, and may for example, be faster than 10 msec, 1 msec, 100 μsec, or even 10 μsec.

Although the readout architecture of the novel fast-timing bi-directional CCD's is new, no new fabrication technologies are needed to construct the novel CCD's.

A fast-timing CCD has numerous applications for viewing images when either the subject or the camera is in motion. For spectroscopic applications where individual photons are detected to measure the photon energies, a CCD with fast timing capable of isolating individual photons will be extremely useful. Examples of such spectroscopic applications include non-destructive testing, medical imaging, fluorescence studies, astronomy, material science and surface physics measurements. In long-duration exposures of low intensity or low contrast objects, a fast timing CCD would allow the final image to be summed from discrete, short-duration individual exposures in which blurring due to motion can be removed and cosmic ray events can be vetoed. Examples of applications of long-duration exposures include, for example, radiological searches for small lesions in the presence of motion (for example, that induced by a patient's breathing), and extended satellite observations of faint astronomical objects in the presence of an ionizing cosmic ray background passing through the detector.

With a standard CCD readout architecture, each of the photosites in a rectangular array collects light over an integration time $t_{int} \gg 50$ msec. If a photon strikes a photosite (i,j) during the integration, a photoelectron is generated at that pixel. At the end of the integration, the charge on each pixel is clocked vertically upward one row at a time. After each vertical transfer, one row of charge has been transferred into the horizontal readout register at the top of the chip. The individual pixel (column) charge packets in the horizontal readout register are then clocked horizontally to the output amplifier. Then the entire array is again shifted vertically one row; the horizontal readout register is again shifted horizontally; and the charge transfer process continues until all rows and columns have been shifted to the output amplifier. The entire cycle is then repeated.

Rather than a photon arriving at pixel (i,j) during the integration time, however, suppose that a photon arrives at pixel (i,j) at a time $t_y$ after the start of the readout. If the time between vertical transfers is $t_{row}$, then $t_y/t_{row}$ rows will have been clocked upwards by the time the photon arrives at (i,j). A photoelectron will still be produced at (i,j), but it will be read out as if it had instead been produced during the integration time at pixel (i+$t_y/t_{row}$, j). In conventional CCD applications, a photon arriving during the readout and producing a spurious signal would be considered background noise. A shutter is frequently used to block light input to the CCD during a readout cycle to prevent this background.

Figure 1:
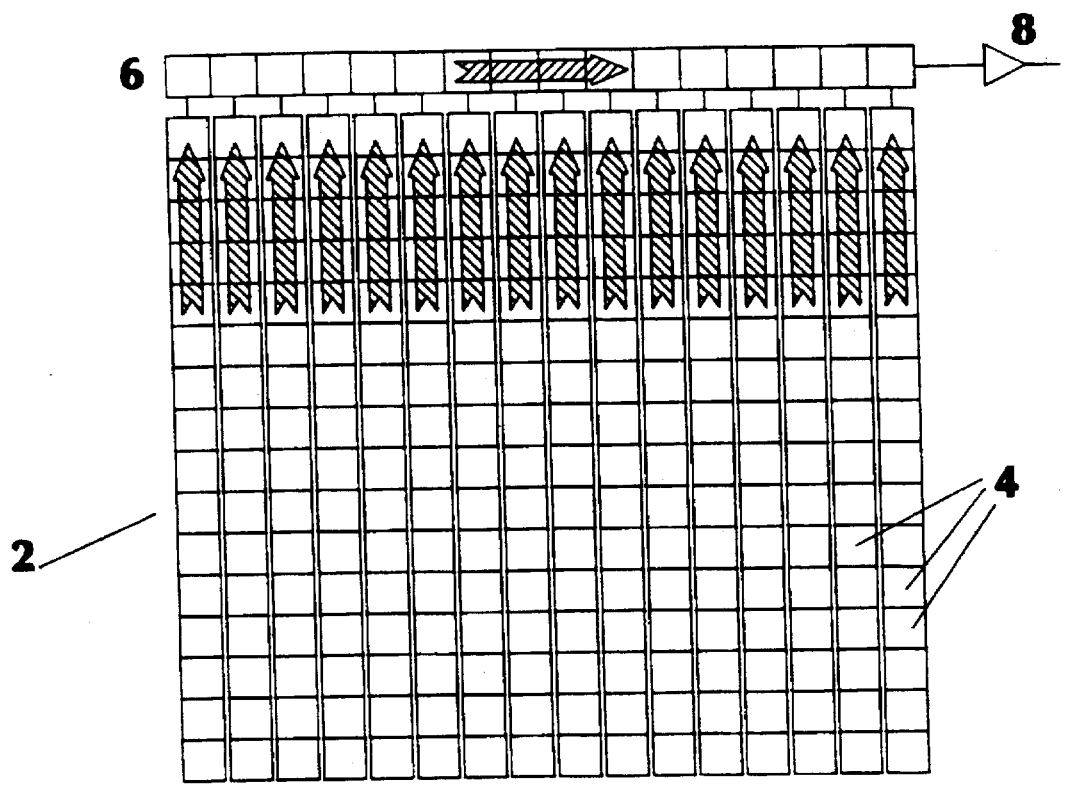
FIG. 1 depicts a conventional CCD.
Figure 2:
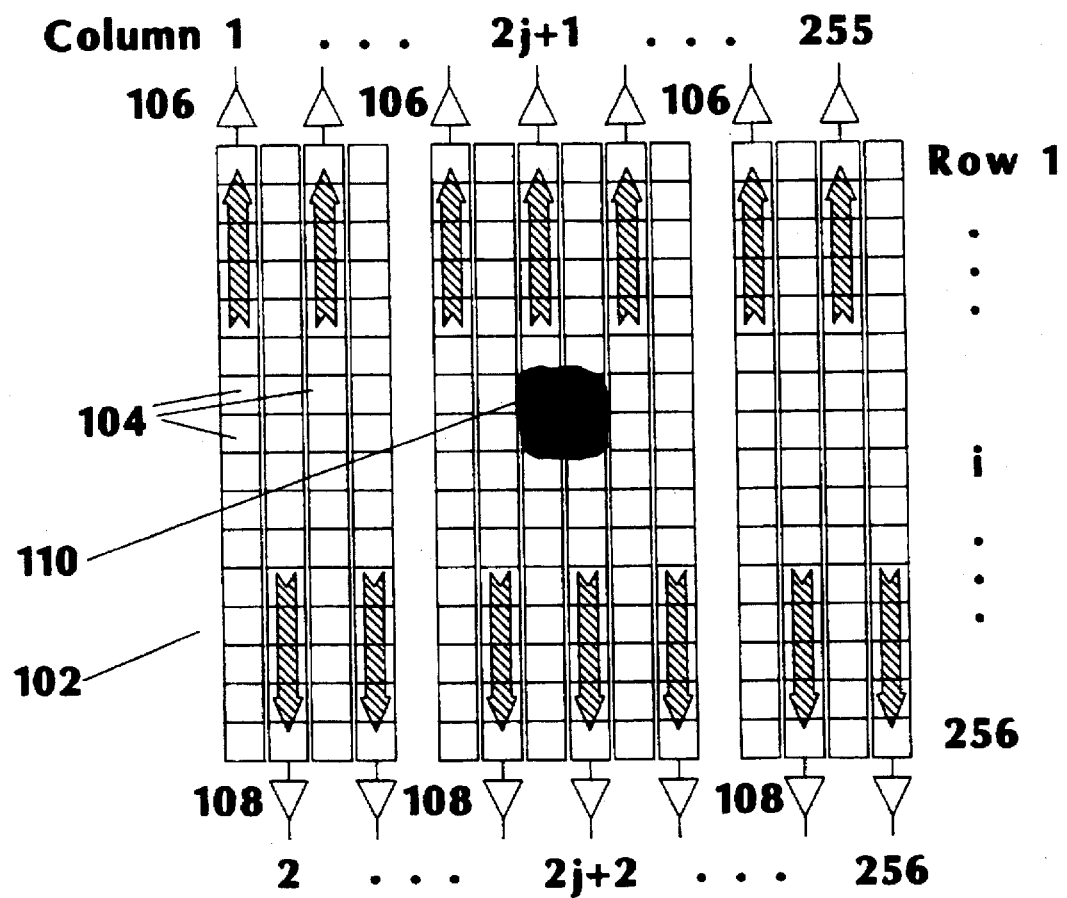
FIG. 2 illustrates an embodiment of a novel CCD in accordance with the present invention.

With the fast-timing bi-directional CCD, however, it is possible to use this situation advantageously to determine the arrival time $t_y$, especially in the case of low flux. No shutter is needed, and the CCD is continuously available to receive input photons. Suppose, for example, that x-rays are absorbed in a scintillator microfiber or metal matrix array with a position resolution of 100 μm, and that the scintillator is viewed by a bi-directional CCD array with a pixel pitch of 50 μm. An optical signal from the scintillator is then seen simultaneously by pixels in at least two adjacent columns of the CCD. Referring to FIG. 2, if the columns are clocked continuously, with odd columns clocked upward and even columns clocked downward, then the signature of an event (illustrated by charge cloud 110) will be hits in two adjacent columns at (i+$t_y/t_{row}$, 2 j+1) and (i−$t_y/t_{row}$, 2 j+2). The actual row position is the average 0.5 [(i+$t_y/t_{row}$)+(i−$t_y/t_{row}$)], and the event arrival time is given by the difference 0.5 $t_{row}$ [(i+$t_y/t_{row}$)−(i−$t_y/t_{row}$)].

If the number of rows is $n_{rows}$, then the time to read out the entire array is $n_{rows} t_{rows}$, which equals 13 msec for a 512×512 array that is clocked vertically every 25 μsec.

The flux should be sufficiently low that the probability of seeing more than one event per two adjacent columns per full-frame readout time is small:

$$F < 1/(2\, n^2_{rows}\, d^2 t_{row})$$

where d is the pixel size. (In the example above, for d=50 μm, the limiting flux is about $3 \times 10^3$ x-ray photons per cm$^2$ per sec.)

For the 50 msec readout on the commercially available Loral CCD, the train of 5 MHz horizontal clock pulses generates noise and draws power, as does the analog-to-digital converter ("ADC") (which must perform a pulse height conversion in approximately 300 nsec). In the novel bi-directional CCD, however, at the limiting flux the average number of hits per row is <<1. For example, in the case of a 100 μm diameter spot viewed by 50 μm pixels, an average of 4 pixels are illuminated per hit, and the number of illuminated pixels per row is 2/$n_{row}$, a small value. The complications imposed by the short ADC conversion time and fast horizontal clocking are therefore eased if a sparse readout is employed. By feeding the $n_{row}/2$ outputs (e.g., 256 in the example above) from the odd columns at the top through a multiplexer to a single ADC, and feeding the $n_{row}/2$ outputs from the even (bottom) columns through a multiplexer to a second ADC, the horizontal clocking is eliminated and (allowing for a maximum of m pixels hit per row) the ADC conversion time becomes $t_{row}/m$. (For m=10 in the example above, this time becomes 2.5 μsec per ADC conversion).

The novel bi-directional CCD improves time resolution while simultaneously slowing down the clocking; these two characteristics substantially reduce noise levels, and substantially improve charge transfer efficiency.

The largest contributor to multi-phase CCD dark current is thermal noise from surface states at the Si—SiO$_2$ interface. If there is a large population of electrons in the valence band, and if there are unoccupied surface states available to accept electrons, then electrons can jump from the valence band to form a dark current electron-hole pair. A technique to minimize this source of dark noise is the Multi-Pinned-Phase (MPP) approach, in which the vertical clocks are all left in the low state during the integration cycle. With a negative bias sufficiently low that the potential at the Si—SiO$_2$ interface drops below that of the substrate, holes from the channel stops migrate into the interface, thereby filling the interface states and suppressing the valence electron transitions. However, when the clocks are switched from inverting to non-inverting to transfer the accumulated charge, some of the trapped holes will be ejected from the interface with sufficient velocity to release spurious electron-hole pairs by impact ionization. This impact ionization signal is minimized by slowing down the leading edge rise time of the clock pulse. In the case of a typical MPP CCD, the vertical registers are therefore operated inverted, but the faster horizontal registers are operated non-inverted to minimize the spurious impact ionization contribution. This approach is reasonable, because the time required for horizontal shifting is small, and the build-up of any dark noise during that time is correspondingly small. The bi-directional CCD provides the advantages of both slow clocking and fast readout. Because the horizontal register is eliminated, the clock pulses may be relatively slow ($t_{row}$~25 μsec), and the leading edge rise times correspondingly slow. The full frame readout time is small ($N_{row} t_{row}$~18 msec for a 512×512 array), and dark noise build-up is therefore inherently small.

At low light levels, the pixel-to-pixel charge transfer is dominated by thermal diffusion with a time constant $$\tau = 4 d^2/\pi^2 D$$

where d is the pixel size, and D is the diffusion coefficient (In silicon at 300° K., D=34.9 cm$^2$/sec for electrons, and D=12.4 cm$^2$/sec for holes). For the 15 μm pixels of the Loral 442 A, the electron diffusion time is τ=26 nsec. For a 3-phase CCD, the charge transfer efficiency CTE (for a single pixel) is $$CTE = (1-e^{-t/\tau})^3$$

so that CTE can be low for sufficiently short times t. For example, CTE=99.86% for t=200 nsec, τ=26 nsec. With this efficiency, only 24% of the charge will be transferred across 1024 pixels (half of a 30 mm Loral 442 A). In the case of a 512×512 (d=50 μm pitch, $t_{row}$=25 μsec) bi-directional CCD, however, τ=290 nsec and CTE is no longer limited by thermal diffusion.

The novel fast timing CCD may be used in any application in which conventional CCD's have previously been used. Some applications for which the novel fast CCD's are particular well-suited are the following:

Application I. X-Ray/γ-Ray Astrophysics and Solar Physics (One Minute-of-Arc Resolution Gamma Ray Imaging)

The case of hard x-ray/γ-ray astronomy offers an interesting example. The best angular resolution thus far achieved at these energies has been the 13' of arc obtained by the SIGMA satellite experiment. By contrast, a novel bi-directional charge coupled device in accordance with the present invention in conjunction with a coded aperture instrument and a fine-grained mask can achieve an angular resolution of 1' over the energy range 30–600 keV. An array of CsI (Tl) microfibers or a segmented CsI matrix detector serves as the active x-ray detector, with optical scintillation from the CsI detected by a crystal silicon CCD array in accordance with the present invention. Millisecond time resolution is desirable for observing pulsars (e.g., the Crab) and gamma ray bursts; time resolution of 25 μsec or faster is needed to operate in anticoincidence with an active charged particle shield, in order to veto the cosmic ray events that strike a typical balloon or spacecraft payload every 200 μsec or more often. The ability to isolate individual x-ray photons is required to measure photon energies.

Angular resolution is an essential ingredient in hard x-ray and γ-ray observations of solar flares and discrete astrophysical sources. Improvements in angular resolution permit the identification of individual sources, both isolated sources and those located in crowded regions of the sky; reduce the number of potential candidate sources due to detector error; and improve the signal-to-noise ratio for discrete sources. This application may be used in either a satellite- or a balloon-borne, coded aperture, hard x-ray telescope designed to cover the energy range 30–600 keV with a wide field of view (~8° half angle) and a high angular resolution~1' (i.e., approximately an order of magnitude better than SIGMA, the best previous space-borne instrument).

In the coded aperture approach, a uniformly redundant array (URA) mask pattern minimizes sidelobe artifacts in the reconstructed image of the sky by requiring that the autocorrelation have a delta function spike along the axis in the direction of the source, and a uniform background in other directions. An advantage of the coded aperture approach is that the source and the background are measured simultaneously, thereby minimizing systematic effects caused by time- or zenith angle-dependent background changes.

A high angular resolution, broad field-of-view, hard x-ray instrument has not previously been built; such an instrument could address many outstanding questions in astrophysics and solar physics. Possible scientific goals which could be addressed include the following: (1) high sensitivity spectral studies in the 30–600 keV region to distinguish between high-temperature thermal sources and low-temperature sources with hard non-thermal tails; (2) extensive sky coverage at high angular resolution; (3) searches for additional gamma-ray pulsars; (4) studying accretion flows and neutron star magnetospheres of x-ray binaries in the 30–600 keV energy band, where little is known about the detailed emission processes; (5) spectral shape measurements and temporal studies of Cygnus X-1 and other candidate galactic black hole binary systems to determine electron temperatures at the source, to study the "high-energy tail" emission, and to evaluate models of the γ-ray emission; (6) high angular resolution measurements of active galactic nuclei ("AGN's") to correlate with higher energy Compton Gamma Ray Observatory observations, to study the contribution of AGN's to the diffuse cosmic background; (7) observations of crowded source regions such as the Galactic Center, to give spectral measurements with high angular resolution over an extended, continuous time period (e.g., 10–20 days for a long-duration balloon mission); (8) measurements of fundamental and higher harmonics of cyclotron features associated with x-ray pulsars; (9) searches for positron line emissions, both at 511 keV and at lower energies (redshifted) from pulsars, gamma ray bursts, black hole candidates, the Galactic Center, and other sources; (10) measurements of the spectrum and source position of γ-ray bursts in the 30–600 keV range at 1' arc angular resolution—correlations of such observations at several wavelengths should improve the understanding of this baffling class of high energy sources; (11) the morphology of solar flare regions—following the population of accelerated electrons and observing the frequency and extent to which these electrons escape the flaring region; (12) measuring the flux of hard x-rays from electron bremsstrahlung at several hundred keV as a surrogate for imaging nuclear emissions during solar flares; (13) studies of low intensity and high variability emission, either in small flares or brightenings or prior to hard x-ray and γ-ray emission in larger flares; and (14) high time- and angular-resolution measurements of hard x-ray emissions over the full solar disk.

Solar flares and astrophysical point sources may be detected with high sensitivity and high angular resolution over the energy range 30–600 keV with the novel fast CCD, also maximizing the probability of detecting and locating γ-ray burst sources. Such an instrument preferably satisfies the following criteria: (1) large detection area (at least 1000 cm$^2$); (2) large field of view (~8° half angle); (3) high angular resolution (δθ~1')—in a coded aperture detector this angular resolution implies mask element dimensions and central detector position resolution ~0.5 mm, with a mask-detector spacing of 1.5 m; (4) suitability for space and long duration balloon flights (up to 3 week mission durations).

To obtain the fine-gained position resolution required for the detector, a CsI micro fiber or matrix array will be coupled to a bi-directional fast-timing crystal silicon CCD in accordance with the present invention. The CsI (Tl) output spectrum peaks near the same wavelength as the maximum sensitivity of the silicon semiconductor detectors in the CCD (540 nm). The scintillator light yield (20 optical photons/keV) and CCD noise levels (10–25 pA/cm$^2$ at 20° C. thermal, 10 e$^-$/pixel readout noise) combine to give a threshold below 30 keV. Both the CsI and the CCD resolution are better than the coded aperture mask element diameter (0.5 mm), leading to an angular resolution (at 1.5 m mask-detector separation) of 1'. The CCD capabilities are driven largely by the requirements that the detector be able to measure individual photon energies, and that the detector operate in the presence of a flux of cosmic ray protons. An anticoincidence shield surrounding the instrument will register a cosmic ray hit on average every 100–200 μsec, so that a CCD operated in conjunction with this cosmic ray veto device should have a time resolution significantly better than 100 μsec. A similar time resolution is appropriate for studies of fast pulsars or for high time resolution studies of gamma ray bursts.

For x-ray astronomy at 30 keV, the CsI scintillator produces 20 optical photons/keV, which are detected with 35% quantum efficiency by the CCD. If each photon produces 1 electron and the signal is split over 4 pixels, then a 30 keV threshold signal corresponds to approximately 50 electrons/pixel. If the total (readout plus thermal) noise is 10 electrons/pixel (rms), then the chance of spurious hits at the 5σ level simultaneously in 4 contiguous pixels in a 512×512 array is exceedingly small.

Thermal noise is reduced by shortening the frame readout time. The dominant noise contributor is then expected to be the on-chip amplifier. As the charge leaves the shift register, it is deposited on the gate of the output FET. The resulting voltage is V=q/C, where C is the associated output node capacitance. To increase the sensitivity, one may decrease the capacitance C, i.e., make the amplifier physically smaller. Before another charge packet is transferred out, however, the capacitor must be recharged to a fixed potential. This reference level corresponds to a charge uncertainty $(kT/C)^{1/2}$=4.0×10$^8$/C$^{1/2}$ (rms) at room temperature, an uncertainty that increases with decreasing capacitance. The intrinsic 1/f noise of the output transistor also increases with decreasing size, so that there is a trade-off between sensitivity and output node read noise. In practice, the optimum geometric size for the amplifier is ~10–100 μm on a side. In the case of a (25 mm)$^2$ bi-directional fast-timing CCD with 256 amplifiers across the top and 256 across the bottom, the required physical space (~100 μm/amplifier) is available on the chip.

The readout chain is the key to CCD noise performance. As an example, the JPL CCD Video Preamplifier used on the Hubble Space Telescope and the Galileo spacecraft, as well as in numerous other JPL camera systems, has extremely low noise levels (<2 electrons rms), making it possible to operate at the Fano noise limit. See J. R. Janesick et al., *SPIE Proc.*, vol. 1071, pp. 115 ff (1989). This highly optimized design for extremely low noise operation may not be needed in all applications, as it is possible to trade higher noise for lower power consumption. The pre-amp power dissipation is largely governed by the current through the 2N5564 JFET and op-amp of the Janesick et al. device. These two pieces can be replaced with lower-power (but somewhat higher noise) components, and the differential amplifier circuitry can be removed. These changes will simplify the circuit and decrease power consumption significantly, but leave the circuit more susceptible to temperature shifts and power supply noise. Additional care must therefore be taken with shielding, noise, and power supply filtering. An advantage of the bi-directional CCD lies in the presence of the multiple simultaneous outputs, one for each of the columns. First, power supply noise appears simultaneously in the multiple channels, and can thus be recognized and removed from the data. Second, voltage or temperature drifts cause an increase or decrease in the number of pixels above threshold. The rate of pixel hits above threshold is monitored, and temperature drifts should also be immediately recognizable from the data.

Frequent calibration and correction of gain is preferred. A preferred calibration source is an $^{241}$Am x-ray source that produces x-rays in coincidence with an alpha particle. If the source is imbedded in a small plastic scintillator viewed by a photomultiplier tube, then every x-ray is accompanied by a simultaneous α-particle pulse to give a "calibration flag" from the photomultiplier tube. If the calibration source is placed near the CCD, but to the side, out of the field of view, ~5% of the calibration flags may be accompanied by x-ray hits in the CCD, which can be recognized by the timing coincidence.

Figure 3:
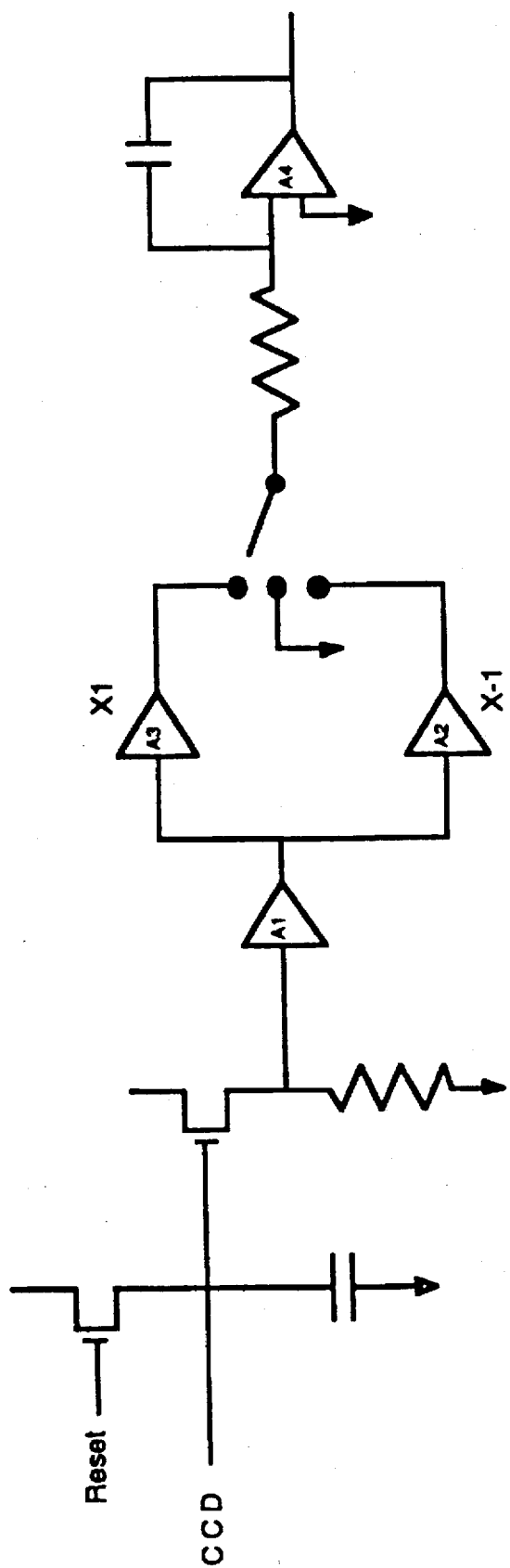
FIG. 3 illustrates a correlated double sampling noise suppressor.

With a typical output node capacitance of 0.1 pF and sensitivity of 1–10 μV/e$^-$, the kT/C noise is 130 e$^-$ rms without cooling, significantly larger than the desired 30 keV threshold signal. A standard method for dealing with kT/C and 1/f noise components is a correlated double sampling (CDS) noise suppressor such as that illustrated in FIG. 3. Amplifier A1 acts as the pre-amp and low pass filter. Its output is connected to the integrator A4 through amplifier A2 for a fixed period of time while the output node capacitor is fixed at its reference level, and then through amplifier A3 (which is identical to A2 but opposite in polarity) for an equal time to measure the signal pulse. The integrator then measures the integrated pixel charge through A1 minus the baseline just prior to the charge transfer, therefore effectively canceling the output node noise on all scales faster than the integration time.

Figure 4:
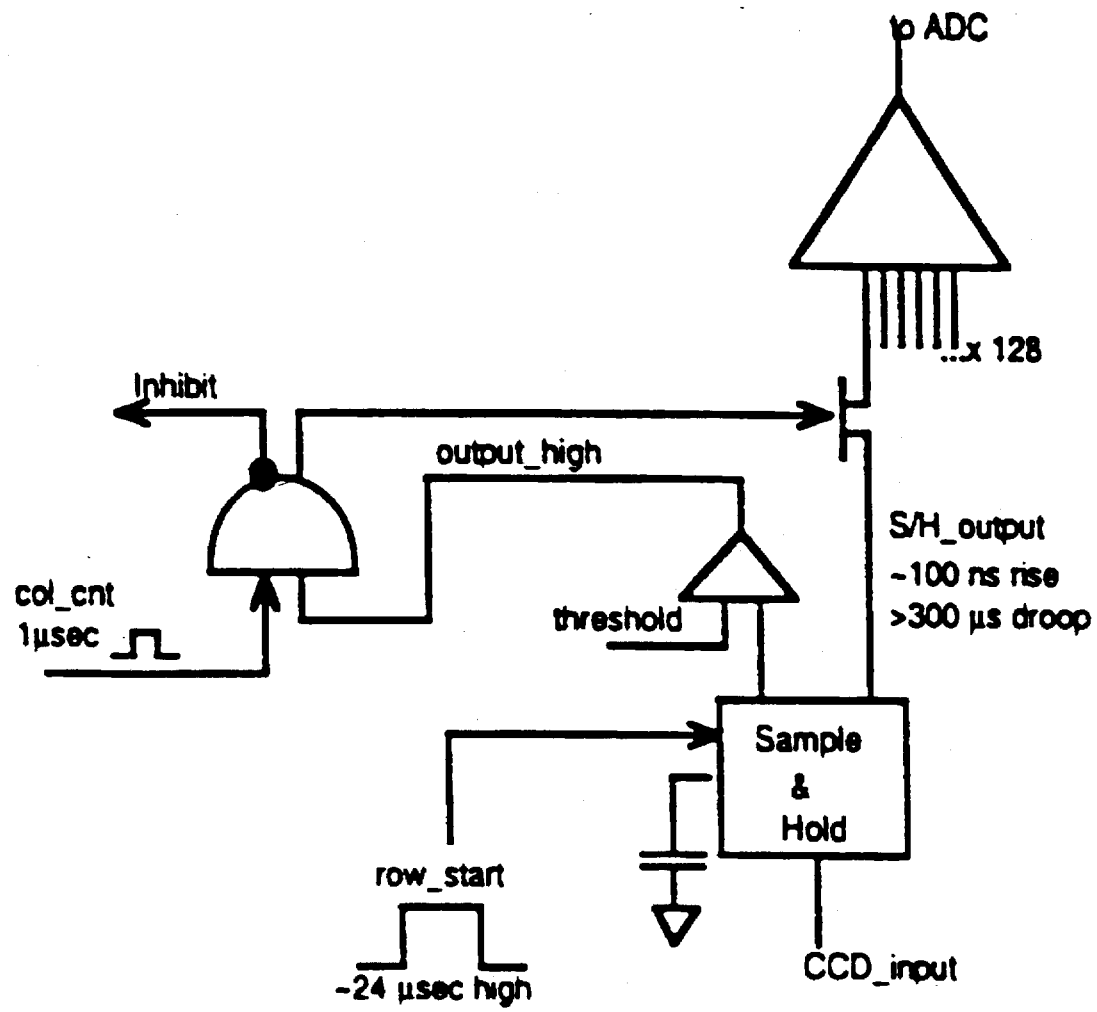
FIG. 4 illustrates a sample-and-hold circuit.

The integrator output feeds a sample-and-hold circuit. (See e.g. FIG. 4.). For example, in a case where a 512×512 pixel CCD is divided into a left half and a right half, with 128 sample-and-holds on the top left, 128 on the top right, 128 on the bottom left, and 128 on the bottom right, the multiple outputs from each quadrant can be multiplexed into a single analog-to-digital converter (ADC). Assuming $t_{row}$= 25 µsec, and that the ADC can handle m=10 hits per readout, then an ADC conversion time of 2.5 µsec is required and the S/H output must have a rise time that is short compared to $t_{row}/m$ (e.g., ~100 ns) and a drop that is long compared to $t_{row}$ (e.g., greater than 300 µsec). The S/H is controlled by the row__start pulse, so that at the end of ~24 µsec the S/H__output is reset to zero and allowed to settle for ~1 µsec before the next row__start. The S/H__output goes to (1) a low-noise FET and (2) a comparator that compares S/H__output to a preset DC level threshold. If S/H__output is above threshold, the output__high pulse goes high and stays high for 24 µsec (ignoring the drop of S/H__output). At the start of the row readout, row__start sets a column counter to zero, and the counter then sends out a 1 µsec gate pulse (col__cnt) to the first column. If output__high is high, the resulting 1 µsec-long AND opens the FET and sends the analog S/H__output pulse to the ADC. Simultaneously, the digital counter output (column__id) goes to the data acquisition system. When col__cnt goes low, inhibit goes high and the counter increments the column counter and goes to the next column. After the column counter increments, it waits 20–50 nsec until col__cnt has a chance to drive inhibit low. If inhibit remains high (or as soon as inhibit goes high again after a column is read), the counter increments.

Existing low-noise 128-channel multiplexers have been implemented as custom integrated circuits: e.g., the Lawrence Berkeley Lab SVX, the CERN Viking series of chips, and the RAL Analogue Microelectronics MX3. It would be possible to mate a CERN VA1 (the latest low-noise variant of the Viking series) to the CCD output, but it is preferred instead to use a low-noise pre-amp incorporating CDS noise suppression with a multiplexer, implemented as CMOS directly on the CCD chip.

Application II. Medical Imaging

Current x-ray mammography devices typically rely on photographic film. Although film provides significantly better spatial resolution than do existing commercially available CCD instruments (which have a resolution of 8–9 line pairs/mm at best), the limited dynamic range and contrast of photographic film are disadvantages. These disadvantages are particular limitations in cases where a radiologist needs to study soft tissue masses or microcalcifications in breast tissue, or to search for faint lesions in the presence of nearby high-density glandular material, or to perform dual-energy comparisons of attenuation in carcinoma and normal tissue.

By combining a relatively thick CsI microfiber array with a high resolution fast-timing CCD readout, by removing the standard reducing fiber optic taper, and by reducing the noise level (and hence the need for cooling), one has the advantages of potentially lower x-ray exposure for the patient, higher contrast and energy resolution, reduced complexity and cost, and a position resolution that is suitable for detailed diagnostic applications.

For example, in a mammography examination, a patient's typical x-ray exposure may be on the order of $10^5$ photons/mm². A frequent complaint by physicians is the lack of contrast sometimes seen in dense tissue regions. A solution to this problem is to use higher energy x-rays. As the energy increases, however, the fraction of Compton-scattered photons increases, showing up as photons from spurious directions. In other words, Compton scattering produces an unwanted background. In the approximation that tissue is essentially water, then for example at 60 keV the ratio of the incoherent scattering cross section to the photoelectric cross section is nearly 30 and the situation is severely background-limited. This background can be removed by measuring individual x-ray energies, which can only be accomplished in a detector with sufficient time resolution to identify individual events. If a CCD comprises $N_{rows} \times N_{rows}$ square pixels each of pitch d, and if each row is read out in a time $t_{row}$, then the total readout time is T=$N_{rows} \times t_{rows}$. Individual events can be identified if the flux F is sufficiently low that there is not more than 1 event for every 2 columns over the readout time:

$$F < 1/(2 N_{rows} \, d^2 \, T) = (256/N_{rows})^2 \, (50 \, \mu m/d)^2 \, (10 \, \mu sec/t_{rows}) \, (300/mm^2 \, sec)$$

For a sharp image, one desires a signal-to-noise ratio $S/N^{0.5} \sim 10$ in a single pixel, corresponding to 100 events/pixel in the absence of background (e.g., if the noise can be removed by accepting only events with energy in the photopeak). Let r be the ratio of scattered flux to unscattered flux (where r may be significantly greater than one). If the energy is not measured and the scattered photons cannot be separated from the unscattered, then N~rS and $S/N^{0.5} \sim 10$, so that the required number of "good" (unscattered photopeak) events becomes S~100 r. The total number of incident x-rays must then be 100 r². The patient's dosage is:

$$D_{noise} = (100 \, r^2/d^2 \, T) \, (photon/mm^2 \, sec)$$

If, however, the energy can be measured, then only unscattered photopeak x-rays are accepted and N=S=100. The total number of incident photons is then 100 r and the patient's dosage is a factor of r lower than in the previous case:

$$D_{no \, noise} = (100 \, r/d^2 \, T) \, (photon/mm^2 \, sec)$$

For the fast-timing CCD to measure individual x-ray photons, the flux must be kept sufficiently low that individual events can be resolved. In that case, the total exposure time needed to collect 100 events/pixel is $$t_{exp} = (N_{rows}/256)^2 \, (t_{rows}/10 \, \mu sec) \, (130 \, sec.)$$

A time on the order of 130 seconds is far too long for a patient to remain stationary, but the observation can readily be broken into small intervals. By the use of fiducial markers on the patient, the images from the small intervals can be oriented and added together to give a composite image with a potentially significant decrease in total patient x-ray dosage.

Application III. Particle Physics and Cosmic Rays

Ring Imaging Cerenkov Detector for Charged Particles

Ring Imaging Cerenkov (RICH) detectors can accurately determine the velocity of energetic particles by measuring the angle at which Cerenkov radiation is emitted. RICH detectors have been used for many years in high energy physics experiments at particle accelerators, and more recently in cosmic ray balloon-borne experiments. A RICH detector can be very sensitive—in principle, if a particle's trajectory is known then the ring radius and consequently the Cerenkov angle can be determined from a single detected photon. In practice, however, the sensitivity depends on the position-sensitive photon detector being used. Most RICH photon detectors are gas-filled drift or proportional detectors, in which the gas is made photosensitive by a small amount of tetrakis dimethylamino ethylene (TMAE). It has been difficult generally to construct reliable, long-lifetime gas detectors for space flight applications; TMAE, in particular, is a volatile gas that is very difficult to handle. Thus using solid state CCD arrays as photon detectors would be an advantage for space flight RICH detectors if such detectors could be made practical. However, Cerenkov radiators generate only small amounts of light and the Cerenkov photons are distributed across the ring, which for practical detectors could be several thousand $cm^2$ in area. Therefore, detecting the Cerenkov photons above the CCD noise level would be difficult with prior CCD's, but not with the novel fast-timing CCD.

A fast-timing CCD with 10 μsec resolution, in conjunction with an image intensifier, can be operated in coincidence with a charged particle trigger. For example, with a solid sodium fluoride (NaF) RICH detector with index of refraction n=1.4 and Cerenkov angle (for β=1) θ=44°, a 1 cm thick detector produces a filled-in circle of light of radius 0.98 cm at the back end of the NaF. A singly-charged β=1 particle produces ~100 Cerenkov photons, which can readily be amplified by a factor greater than 10 in an image intensifier (without cooling), resulting in a Cerenkov signal of 1000 electrons or more. Current CCD thermal noise levels ~10 $pA/cm^2$ correspond to an rms noise level of $3.1 \times 10^3$ electrons for an area $\pi(0.98 cm)^2$, and a readout time of 50 msec. This is a very fast readout for a large area CCD. The commercially available Loral Fairchild 2 k×2 k CCD 442A achieves this rate, but only by employing a 5 MHz clock speed; such a high clock speed produces consequently high noise and power consumption. Unless the CCD is cooled (a non-trivial undertaking for a large CCD array of area ~$10^3$ $cm^2$) or the 50 msec integration time is reduced, this thermal noise will overwhelm the signal.

But if the time window were reduced to 10 μsec, the rms thermal noise would decrease to 43 electrons—and such a short time window may be achieved with the novel fast-timing CCD. If the CCD pixels were binned into 1 mm×1 mm pixels, the largest contribution to the overall noise would then be readout noise due to the on-chip amplifier (~10 electrons rms per pixel). Adding the thermal and the readout noise in quadrature gives a total rms noise level (summed over all pixels) of 180 electrons. If a charged particle deposits 40 keV in passing through a 10 μm depletion layer, there will be an ionization signal corresponding to nearly 1700 electrons at the site of the primary particle. Excluding this large primary pulse, the signal-to-noise ratio in the 300 bins centered on the known particle position (i.e., the 300 bins containing the Cerenkov signal) will be greater than 6. Although 10 μsec timing is faster than needed to reduce thermal noise below the level of the readout noise, the timing resolution of the novel CCD makes it possible to eliminate the need for cooling, and allows the fast-timing CCD-image intensifier combination to replace the TMAE photon detector.

Miscellaneous

Novel CCD's in accordance with the present invention may be fabricated in any practical size of use for a particular application: 64×64; 128×128; 256×256; 512×512; or larger. In addition to their use in detecting incident photons, the fast-timing bi-directional CCD may also be used to detect incident charged particles, such as electrons.

The complete disclosures of all references cited in this specification are hereby incorporated by reference. In the event of an otherwise irreconcilable conflict, however, the present specification shall control.

We claim:

1. A charge coupled device for converting photons or charged particles that impinge on said device into a signal; said device comprising a plurality of columns of semiconductor pixels, and a plurality of amplifiers, wherein:

(a) each column of said pixels outputs to one of said amplifiers;

(b) each said amplifier receives output from one or more columns of said pixels;

(c) each said pixel is capable of producing a free charge in response to impinging photons or charged particles;

(d) each said pixel is capable, in response to a clock signal generated either internally in said device or externally to said device, of transferring any free charge on said pixel to a selected neighboring element, wherein a neighboring element is an adjacent pixel in the same column, or is said amplifier corresponding to said column for a pixel that is at the end of said column nearer to said column's amplifier;

(e) each pixel is capable of receiving a free charge from a neighboring pixel in the same column and storing that charge until a clock signal to transfer the free charge is received; except that this limitation (e) need not be satisfied by a pixel that is on the end of a column that is most distant from said column's amplifier;

(f) the free charges within each column are all transferred in the same direction in response to a clock signal; and the free charges in adjacent columns are transferred in opposite directions relative to one another; so that if the free charges in column n are transferred "up," the free charges in column n+1 are transferred "down," wherein n is a positive integer less than the total number of columns;

(g) said amplifier corresponding to each of said columns is connected to the pixel at the end of said column that is in the direction in which the free charges are transferred; so that said amplifier is connected to the "top" pixel in a column in which the free charges are transferred "up"; and said amplifier is connected to the "bottom" pixel in a column in which the free charges are transferred "down"; and wherein said amplifier amplifies the free charges transferred to said amplifier from the pixel to which said amplifier is connected, to output a signal;

whereby the position and timing of photons or charged particles impinging on said device may be determined by correlating the signals from adjacent columns; and whereby the time resolution of said device is equal to the time resolution of the clock signal.

2. A device as recited in claim 1, wherein said device converts photons that impinge on said device into a signal.

3. A device as recited in claim 1, wherein the position of a photon or charged particle impinging on said device is determined as the midpoint of coincident readouts from adjacent columns; and wherein the time of arrival of the photon or charged particle is determined as proportional to the difference in readouts from adjacent columns.

4. A device as recited in claim 3, wherein said device converts photons that impinge on said device into a signal.

5. A device as recited in claim 1, wherein said device comprises at least 256 said columns, wherein each said column comprises at least 256 said pixels, and wherein the time resolution of said device is faster than 10 μsec.

6. A device as recited in claim 1, wherein said device comprises at least 256 said columns, wherein each said column comprises at least 256 said pixels, and wherein the time resolution of said device is faster than 100 μsec.

7. A device as recited in claim 1, wherein said device comprises at least 256 said columns, wherein each said column comprises at least 256 said pixels, and wherein the time resolution of said device is faster than 1 msec.

8. A device as recited in claim 1, wherein said device comprises at least 256 said columns, wherein each said column comprises at least 256 said pixels, and wherein the time resolution of said device is faster than 10 msec.

9. A device as recited in claim 1, wherein said device comprises at least 64 said columns, wherein each said column comprises at least 64 said pixels, and wherein the time resolution of said device is faster than 10 μsec.

10. A device as recited in claim 1, wherein said device comprises at least 64 said columns, wherein each said column comprises at least 64 said pixels, and wherein the time resolution of said device is faster than 100 μsec.

11. A device as recited in claim 1, wherein said device comprises at least 64 said columns, wherein each said column comprises at least 64 said pixels, and wherein the time resolution of said device is faster than 1 msec.

12. A device as recited in claim 1, wherein said device comprises at least 64 said columns, wherein each said column comprises at least 64 said pixels, and wherein the time resolution of said device is faster than 10 msec.

13. A device as recited in claim 1, additionally comprising a shutter.

14. A device as recited in claim 1, wherein said device lacks any shutter.

15. A device as recited in claim 1, wherein each said amplifier corresponds to one of said columns.

16. A device as recited in claim 1, wherein each amplifier corresponds to a plurality of said columns.

* * * * *